(12) United States Patent
Amishiro et al.

(10) Patent No.: US 6,518,592 B1
(45) Date of Patent: Feb. 11, 2003

(54) APPARATUS, METHOD AND PATTERN FOR EVALUATING SEMICONDUCTOR DEVICE CHARACTERISTICS

(75) Inventors: Hiroyuki Amishiro, Tokyo (JP); Kenji Yamaguchi, Tokyo (JP)

(73) Assignee: Mitsubushi Denki Kabushiki Kaisha, Tokyo (JP)

( * ) Notice: Subject to any disclaimer, the term of this patent is extended or adjusted under 35 U.S.C. 154(b) by 166 days.

(21) Appl. No.: 09/713,338

(22) Filed: Nov. 16, 2000

(30) Foreign Application Priority Data

May 1, 2000 (JP) .................................... 2000-132079

(51) Int. Cl.[7] .............................................. H01L 23/58
(52) U.S. Cl. ...................................................... 257/48
(58) Field of Search .............................. 326/41, 44–45, 326/47, 49–50, 82–92, 101–103; 327/108–112; 257/48

(56) References Cited

FOREIGN PATENT DOCUMENTS

| JP | 54-26667 | 2/1979 |
|----|----------|--------|
| JP | 11-214463 | 8/1999 |

OTHER PUBLICATIONS

"A New Variational Method to Determine Effective Channel Length and Series Resistance of MOSFET's", K. Yamaguchi et al., Proc. IEEE 1998 Int. Conference on Microelectronic Text Structures, vol. 11, Mar. 1998, pp. 123–126.

*Primary Examiner*—Vuthe Siek
*Assistant Examiner*—Brandon Bowers
(74) *Attorney, Agent, or Firm*—McDermott, Will & Emery

(57) ABSTRACT

External resistance Rsd1 is obtained using a first evaluation pattern of MOSFETs having a gate contact length Lgc1 and a channel width W1 each (in steps 100 and 102). External resistance Rsd2 is then acquired by use of a second evaluation pattern of MOSFETs having a gate contact length Lgc2 and a channel with W2 each (in steps 100 and 104). Thereafter, sheet resistance Rsh and overlapping portion resistance Rdsw of the MOSFETs are computed (in step 106) in accordance with the following expressions:

$$Rsh = (W2 \cdot Rsd2 - W1 \cdot Rsd1)/(Lgc2 - Lgc1)$$

$$Rdsw = (W1 \cdot Lgc2 \cdot Rsd1 - W2 \cdot Lgc1 \cdot Rsd2)/(Lgc2 - Lgc1)$$

4 Claims, 7 Drawing Sheets

W1a=W1b=W1c=W1d=W
Lgc1a=Lgc1b=Lgc1
Lgc2a=Lgc2b=Lgc2

PRIOR ART

PRIOR ART

APPARATUS, METHOD AND PATTERN FOR EVALUATING SEMICONDUCTOR DEVICE CHARACTERISTICS

BACKGROUND OF THE INVENTION

1. Field of the Invention

The present invention relates to an apparatus, a method and a pattern for evaluating characteristics of semiconductor devices. More particularly, the invention relates to an apparatus, a method and a pattern for evaluating characteristics of MOSFETs (metal oxide semiconductor field effect transistors).

2. Description of the Background Art

In order to operate large-scale integrated circuits (LSIs) at high speeds, it is necessary to boost the ability of MOSFETs contained in the LSIs to drive currents. The requirement has been met conventionally by measures such as reducing the gate lengths L of the MOSFETs or devising a suitable structure of source-drain (S/D) regions therein.

Figure 13A:
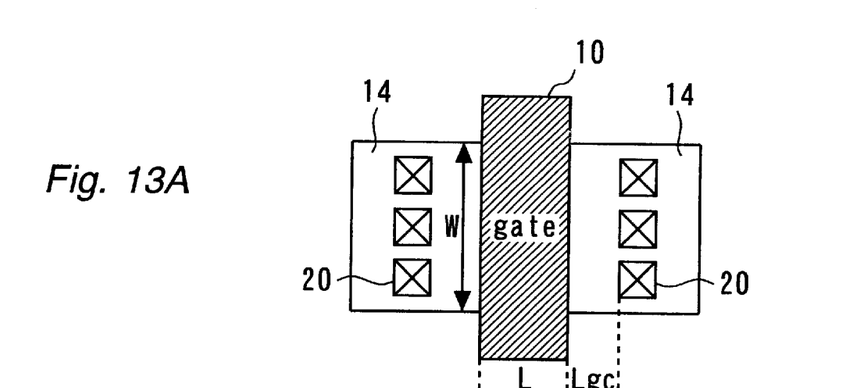
FIGS. 13A and 13B are a plan view and a cross-sectional view of a conventional NchMOSFET having an LDD structure.
Figure 13B:
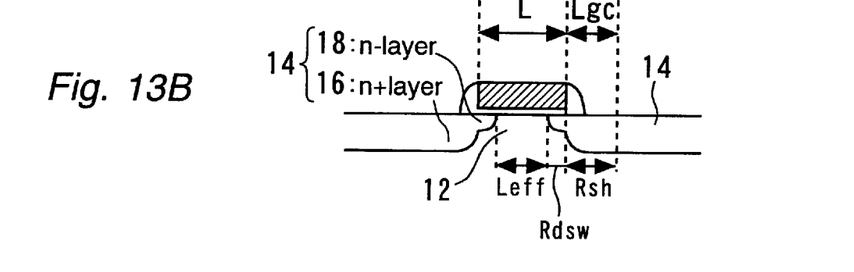

FIGS. 13A and 13B are a plan view and a cross-sectional view of a conventional NchMOSFET having a lightly doped drain (LDD) structure. The illustrated MOSFET comprises a channel region 12 covered with a gate electrode 10 and an S/D diffusion layer 14 formed on both sides of the channel region 12. The S/D diffusion layer 14 has an n+ layer 16 and an n− layer 18. The n+ layer 16 contains N-type impurities at a relatively high density, and the n− layer 18 has N-type impurities at a relatively low density. The MOSFET also includes contacts 20 which are formed a predetermined distance apart from the gate electrode 10 and which conduct electrically to the S/D diffusion layer 14.

In FIGS. 13A and 13B, reference character W stands for a channel width; L for a gate length as well as a total length of the gate electrode 10; Lgc for a distance between one side of the gate electrode 10 on the one hand and the contacts 20 on the other hand; and Leff for an effective channel length of the MOSFET. In addition, reference character Rdsw denotes a resistance value per unit width of the S/D diffusion layer 14 in a portion where the layer 14 overlaps with the gate electrode 10 (the overlapping portion resistance value), and reference character Rsh represents a sheet resistance value of the S/D diffusion layer 14 where the layer 14 does not overlap with the gate electrode 10. The overlapping portion resistance value Rdsw is determined primarily by the resistance value of the n− layer 18. The sheet resistance value Rsh is determined by the sheet resistance value of the n+ layer 16.

The current driving capability of an MOSFET is determined primarily by its effective channel length Leff, its overlapping portion resistance value Rdsw and its sheet resistance value Rsh. It follows that in order to stabilize the quality of MOSFETs by accurately managing their current driving capabilities, it is necessary to measure such characteristic values with precision.

Figure 14A:
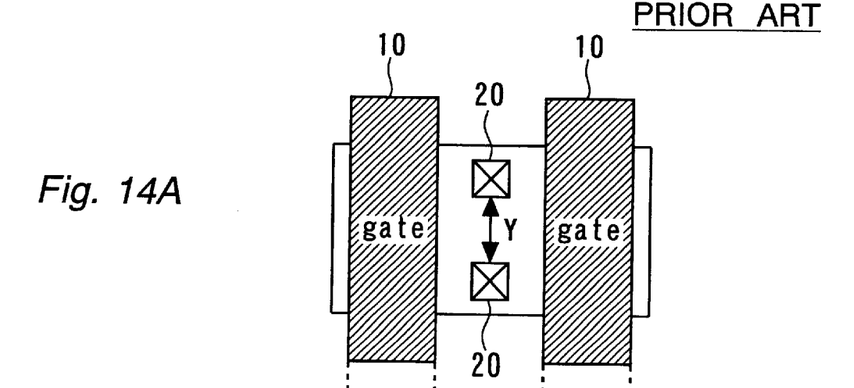
FIGS. 14A and 14B are a plan view and a cross-sectional view of a typical measurement pattern used conventionally to measure sheet resistance.
Figure 14B:
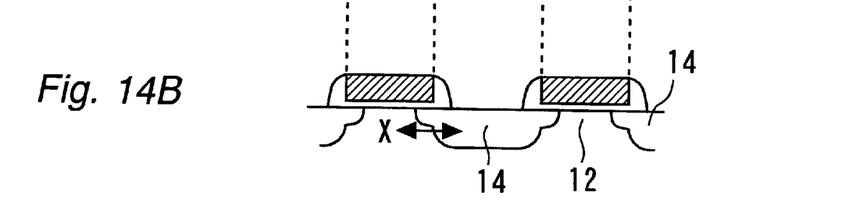

FIGS. 14A and 14B are a plan view and a cross-sectional view of a typical measurement pattern used conventionally to measure sheet resistance. The illustrated measurement pattern allows sheet resistance values to be measured in a Y direction in FIG. 14A but does not permit resistance measurement in an X direction in FIG. 14B. Of the critical characteristic values determining the current driving capability of the MOSFET, the overlapping portion resistance value Rdsw has thus proved especially difficult to measure with ease and precision.

SUMMARY OF THE INVENTION

It is therefore a first object of the present invention to overcome the above and other deficiencies of the related art and to provide a characteristic evaluation apparatus of the semiconductor device suitable for measuring easily and accurately such characteristic values as the above-mentioned overlapping portion resistance value Rdsw and sheet resistance value Rsh.

It is a second object of the present invention to provide a characteristic evaluation method suitable for measuring easily and accurately such characteristic values as the overlapping portion resistance value Rdsw and sheet resistance value Rsh.

It is a third object of the present invention to provide a characteristic evaluation pattern suitable for measuring easily and accurately such characteristic values as the overlapping portion resistance value Rdsw and sheet resistance value Rsh.

The above objects of the present invention are achieved by.

The above objects of the present invention are achieved by.

The above objects of the present invention are achieved by.

Other objects and further features of the present invention will be apparent from the following detailed description when read in conjunction with the accompanying drawings.

DESCRIPTION OF THE PREFERRED EMBODIMENTS

Preferred embodiments of this invention will now be described with reference to the accompanying drawings. Throughout the drawings, like or corresponding parts and steps will be designated by like reference characters, and descriptions of such parts and steps will be omitted where they are repetitive.

First Embodiment

Figure 1:
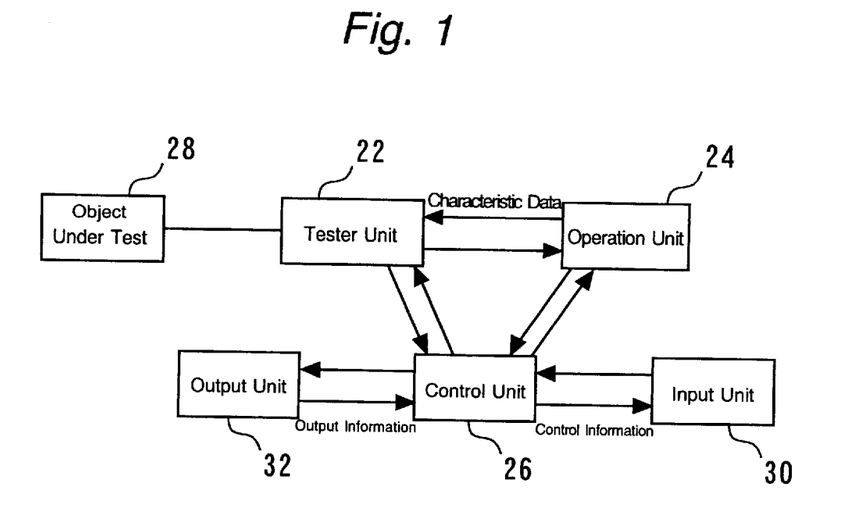
FIG. 1 is a block diagram of a characteristic evaluation apparatus practiced as a first embodiment of this invention.

FIG. 1 is a block diagram of a characteristic evaluation apparatus practiced as the first embodiment of this invention. As illustrated, the characteristic evaluation apparatus includes a tester unit 22, an operation unit 24 and a control unit 26. The tester unit 22 measures electrical characteristics of MOSFETs included in an object under test 28, and supplies the operation unit 24 with the measurements (i.e., characteristic data). Given characteristic data from the tester unit 22, the operation unit 24 computes such major characteristic values as effective channel lengths Leff, overlapping portion resistance values Rdsw, and sheet resistance values Rsh of the MOSFETs being tested. The tester unit 22 and operation unit 24 are controlled in operation by the control unit 26. The control unit 26 is connected to an input unit 30 and an output unit 32. The input unit 30 admits commands and data from the outside, and the output unit 32 permits external data output and display.

Figure 2:
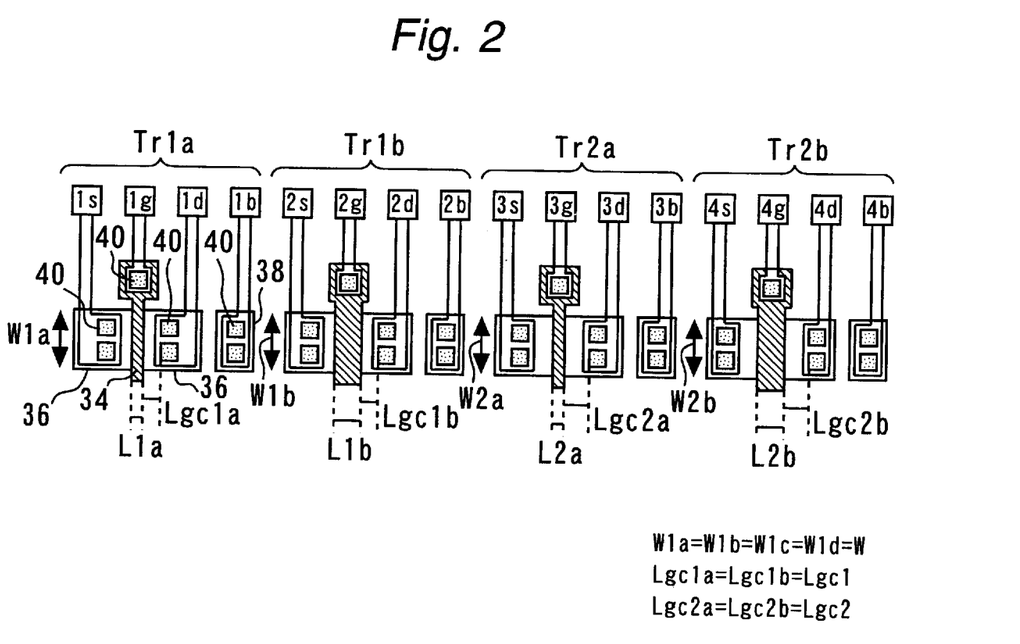
FIG. 2 is a plan view of a characteristic evaluation pattern for use with the first embodiment.

FIG. 2 is a plan view of a characteristic evaluation pattern constituting the object under test 28. The pattern in FIG. 2 includes four transistors Tr1a through Tr2b that are MOSFETs having an LDD structure each. These transistors are structured identically except for different sizes of their components. The structure of the transistor Tr1a is described below as representative of all transistors involved.

The transistor Tr1a comprises a gate electrode 34 covering a channel region, not shown, and two S/D regions 36 flanking the channel region. The transistor Tr1a also includes a back gate electrode 38 that conducts electrically to the channel region. The gate electrode 34 is connected electrically to one end of each of contacts 40 that extend in perpendicular relation to the sheet surface of FIG. 2 viewed by the reader. The other end of the contact 40 conducts electrically to a gate terminal 1g through wiring formed in a layer different from that of the gate electrode 34. Likewise, one of the two S/D regions 36 is connected electrically to a source terminal 1s via a contact 40 and wiring, the other S/D region 36 to a drain terminal 1d via a contact 40 and wiring, and the back gate electrode 38 to a back gate terminal 1b through a contact 40 and wiring.

In FIG. 2, reference characters W1a, W1b, W2a and W2b denote channel widths of the transistors Tr1a, Tr1b, Tr2a and Tr2b respectively; L1a, L1b, L2a and L2b represent their gate lengths; and Lgc1a, Lgc1b, Lgc2a and Lgc2b stand for their gate-contact lengths, i.e., distances between the side of the gate electrode 34 on the one hand and each contact 40 in the S/D regions 36 on the other hand. For the first embodiment, these values are determined in advance as listed in Table 1 below.

TABLE 1

| Tr. | | L μm | W μm | Lgc μm |
|---|---|---|---|---|
| Group 1 | Tr. 1a | 0.2 | 21.6 | 0.6 |
| | Tr. 1b | 20 | 21.6 | 0.6 |
| Group 2 | Tr. 2a | 0.2 | 21.6 | 4.3 |
| | Tr. 2b | 20 | 21.6 | 4.3 |

In the description that follows, the transistors Tr1a and Tr1b are assumed to constitute a group 1 and the transistors Tr2a and Tr2b a group 2 as shown in Table 1 above. With the first embodiment, a common channel width W is set for all transistors. Different gate lengths L are set for two transistors belonging to the same group. Two transistors forming the same group share a common gate-contact length Lgc, while the groups 1 and 2 are subject to a different gate-contact length each.

Figure 3:
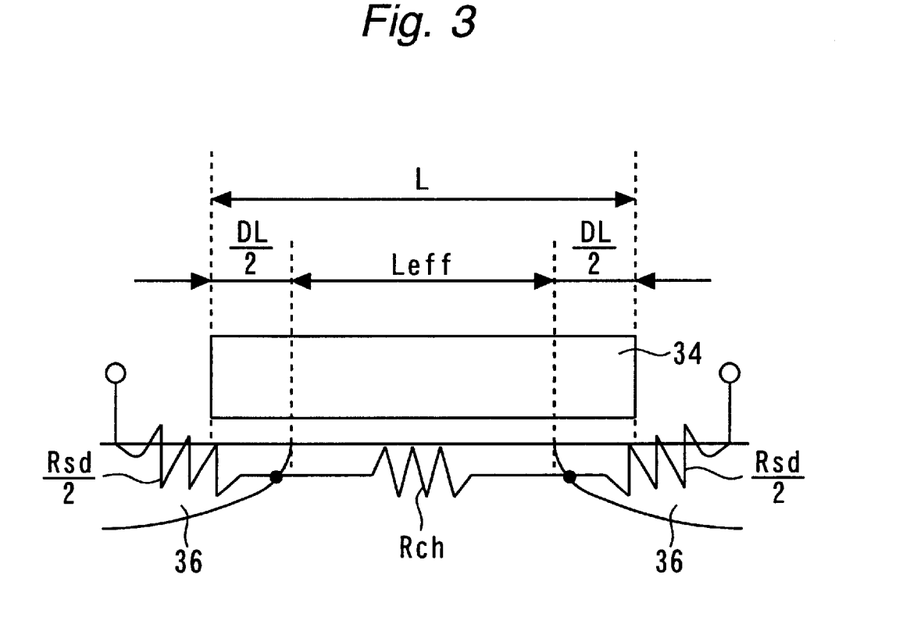
FIG. 3 is an explanatory view showing different kinds of resistance occurring between a source and a drain of an MOSFET having an LDD structure.
Figure 4:
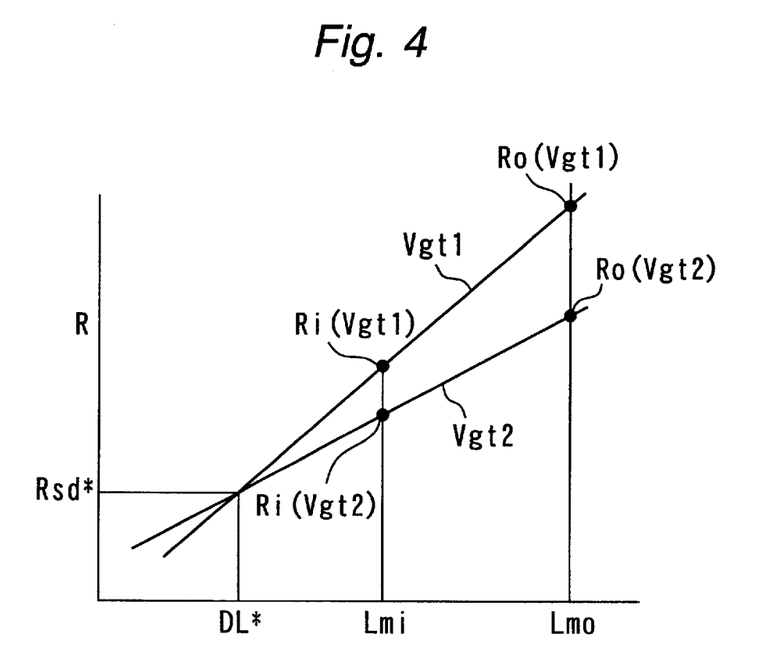
FIG. 4 is a graphic representation depicting a principle applicable to measuring effective channel lengths Leff and external resistance values Rsd of two transistors having the same channel width W and different gate lengths.

Described below with reference to FIGS. 3 and 4 is the principle applicable to measuring effective channel lengths Leff, overlapping portion resistance values Rdsw and sheet resistance values Rsh of MOSFETs. FIG. 3 is an explanatory view showing different kinds of resistance occurring between a source and a drain of an MOSFET having an LDD structure. In the LDD-structure MOSFET, S/D regions 36 are formed in a manner crawling under the gate electrode 34. In FIG. 3, the crawling length of each S/D region 36 is represented by DL/2. In this MOSFET, the effective channel length Leff is obtained by subtracting DL from the gate length L. In that case, the resistance between the source and the drain is given as the sum of the external resistance Rsd in the S/D regions 36 and of a channel resistance Rch in a region applicable to the effective channel length Leff.

FIG. 4 is a graphic representation depicting the principle applicable to measuring the effective channel lengths Leff and external resistance values Rsd of two transistors having the same channel width W and different gate lengths. In FIG. 4, the axis of abscissa denotes mask gate lengths Lm of transistors, and the axis of ordinate represents source-to-drain resistance values R (=Rsd+Rch). Reference character Lmo in FIG. 4 stands for the mask gate length of one transistor (called the long transistor hereunder), and Lmi for the mask gate length of the other transistor (called the short transistor hereunder).

Reference character Ro(Vgt1) in FIG. 4 denotes a resistance value occurring between the source and the drain when a Vgt1 gate overdrive (Vgs−Vth) is applied to the long transistor, and Ri(Vgt1) represents a resistance value occurring between the source and the drain when the Vgt1 gate overdrive (Vgs−Vth) is applied to the short transistor. If the gate overdrive Vgt remains constant, the source-to-drain resistance R changes in linear relation to the gate length L (mask gate length Lm). Thus a straight line (called straight line Vgt1 hereunder) connecting the point Ro(Vgt1) with the point Ri(Vgt1) represents relations between the source-to-drain resistance R and the mask gate length Lm in effect when the gate overdrive Vgt is Vgt1.

Reference character Ro(Vgt2) in FIG. 4 denotes a resistance value occurring between the source and the drain when a Vgt2 gate overdrive (Vgs−Vth) is applied to the long transistor, and Ri(Vgt2) represents a resistance value occurring between the source and the drain when the Vgt2 gate overdrive (Vgs−Vth) is applied to the short transistor. A straight line called straight line Vgt2 hereunder) connecting the point Ro (Vgt2) with the point Ri(Vgt2) represents relations between the source-to-drain resistance R and the mask gate length Lm in effect when the gate overdrive Vgt is Vgt2.

In FIG. 4, the straight lines Vgt1 and Vgt2 intersect at a point where the mask gate length Lm is DL*. The two straight lines intersect under a condition in which the two source-to-drain resistance values R become equal regardless of the value of the gate overdrive Vgs, i.e., under a condition in which the effective channel length Leff is zero. Thus the point DL* may be regarded as indicative of the mask gate length Lm rendering the effective channel length Leff zero, i.e., the mask gate length Lm that causes channel shortening. A source-to-drain resistance Rsd* in effect when the mask gate length Lm is DL* may be regarded as an external resistance Rsd common to the long transistor and the short transistor.

When the mask gate length causing channel shortening is found to be DL* as described, the effective channel length Leff of each transistor is acquired using the length DL*. That is, the effective channel length Leff of the long transistor is obtained by subtracting the length DL* from its mask gate length Lmo; the effective channel length Leff of the short transistor is acquired by subtracting the length DL* from its mask gate length Lmi. As described above, in a case where there exist two transistors sharing the same channel width W and having different gate lengths, the effective channel lengths Leff of the respective transistors are obtained along with an external resistance value Rsd common to the two transistors.

Figure 5:
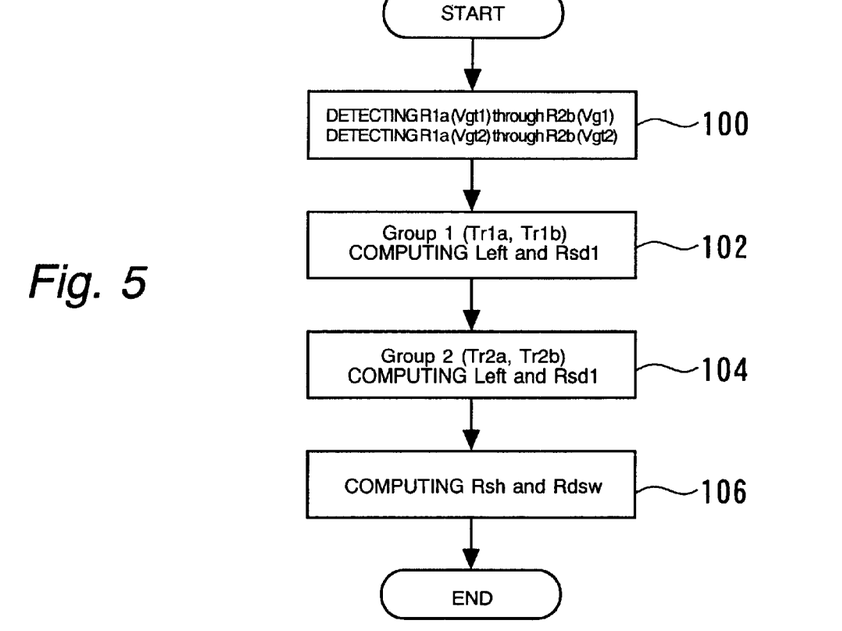
FIG. 5 is a flowchart of steps carried out by the first embodiment.

Described below with reference to FIG. 5 are steps to be performed by the characteristic evaluation apparatus of the first embodiment in measuring characteristic values of the transistors Tr1a through Tr2b contained in a characteristic evaluation pattern.

Step 100 is carried out by the tester unit 22. Using a gate-to-source voltage Vgs as a parameter, the tester unit 22 detects voltage (Vds) and current (Ids) characteristics between the source and the drain in each of the transistors Tr1a through Tr2b. With these characteristics obtained, the tester unit 22 then finds a source-to-drain resistance value R (=Vds/Ids) of each transistor. More specifically, when the gate overdrive is Vgt1, the tester unit 22 detects source-to-drain resistance values R1a(Vgt1) through R2b(Vgt1) in each of the transistors Tr1a through Tr2b; when the gate overdrive is Vgt2, the tester unit 22 finds source-to-drain resistance values R1a(Vgt2) through R2b(Vgt2) in each of the transistors Tr1a through Tr2b.

Steps 102 through 106 are carried out by the operation unit 24. In step 102, the operation unit 24 computes effective channel lengths Leff of the individual transistors in the group 1 (Tr1a and Tr1b) and an external resistance value Rsd1 common to these transistors. The computations are performed by use of the above-described procedure (see FIG. 4) based on the resistance values R1a(Vgt1), R1b(Vgt1), R1a(Vgt2) and R1b(Vgt2) obtained in step 100.

In step 104, the operation unit 24 computes effective channel lengths Leff of the individual transistors in the group 2 (Tr2a and Tr2b) and an external resistance value Rsd2 common to these transistors. The computations are also performed by use of the above-described procedure (see FIG. 4) based on the resistance values R2a(Vgt1), R2b(Vgt1), R2a(Vgt2) and R2b(Vgt2) obtained in step 100.

Step 106 is carried out to compute, on the basis of the external resistance values Rsd1 and Rsd2 of the groups 1 and 2 respectively, the resistance per unit length of those portions of the S/D regions 36 which overlap with the gate electrode 34 (overlapping portion resistance Rdsw) as well as the sheet resistance Rsh of those portions of the S/D regions 36 which do not overlap with the gate electrode 34. Processing of this step is performed specifically as described below.

The external resistance Rsd of a given MOSFET is defined by the following expression using overlapping portion resistance Rdsw and sheet resistance Rsh:

$$Rsd = (Rdsw + Rsh \times Lgc)/W \quad (1)$$

In the case of the first embodiment, the channel width W is common to all transistors. A gate-contact length Lgc is common to two transistors making up the group 1 (Lgc1a=Lgc1b, referred to as Lgc1 hereunder) and another gate-contact length Lgc is common to two transistors constituting the group 2 (Lgc2a=Lgc2b, referred to as Lgc2 hereunder). Thus the expression (1) above holds for the two groups 1 and 2 as follows:

$$Rsd1 = (Rdsw + Rsh \times Lgc1)/W \quad (2)$$

$$Rsd2 = (Rdsw\ 30\ Rsh \times Lgc2)/W \quad (3)$$

When the expressions (2) and (3) are rearranged, the sheet resistance Rsh and overlapping portion resistance Rdsw are given as follows:

$$Rsh = W \times (Rsd2 - Rsd1)/(Lgc2 - Lgc1) \quad (4)$$

$$Rdsw = W \times (Lgc2 \times Rsd1 - Lgc1 \times Rsd2)/(Lgc2 - Lgc1) \quad (5)$$

In step 106, the predetermined values W, Lgc1 and Lgc2 are inserted along with the external resistance values Rsd1 and Rsd2 into the expressions (4) and (5) above in order to compute the sheet resistance Rsh and overlapping portion resistance Rdsw. Table 2 below lists typical results from applying the above-described characteristic measuring method to a 0.18 μm logic process.

TABLE 2

|  | Vthe V | Ids A/m | Leff μm | Rsh Ω/□ | Rdsw Ω μm |
|---|---|---|---|---|---|
| NMOS | 0.58 | 537 | 0.147 | 106 | 77 |
| PMOS | −0.49 | −207 | 0.144 | 201 | 473 |

In the manner described, the characteristic evaluation apparatus of the first embodiment measures with ease and precision the primary characteristic values to determine the ability of MOSFETs to drive currents, i.e., the effective channel length Leff, overlapping portion resistance Rdsw, and sheet resistance Rsh.

The characteristic evaluation pattern for use with the first embodiment above includes one contact 40 conducting to the gate electrode 34 and two contacts 40 conducting to the S/D regions 36. However, this arrangement is not limitative of the invention in terms of the number of contacts 40. Many more contacts 40 may be formed alternatively in a characteristic evaluation pattern.

Although all transistors in the first embodiment are given the same channel width W so as to simplify the computations involved, this is not limitative of the invention. Alternatively, the channel width W of the transistors in the group 1 may differ from that of the transistors in the group 2.

Figure 6:
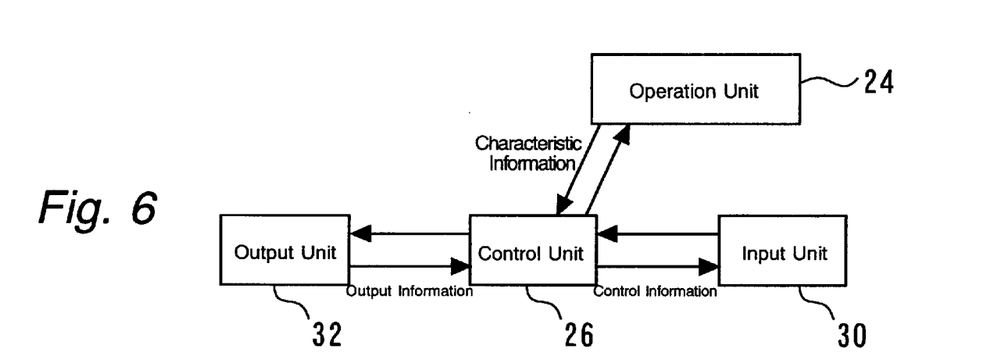
FIG. 6 is a block diagram of a characteristic evaluation apparatus practiced as a first variation of the first embodiment.

The characteristic evaluation apparatus of the first embodiment was shown incorporating the tester unit 22. Alternatively, the tester unit 22 may be excluded from the characteristic evaluation apparatus. FIG. 6 is a block diagram of a characteristic evaluation apparatus as a first variation of the first embodiment having no tester unit 22. In the first variation of the embodiment, an external tester is used to measure resistance values R1a(Vgt1) through R2b (Vgt1) as well as R1a(Vgt2) through R2b(Vgt2). The measurements are then input through the input unit 30. This provides the same results of computation as those obtained by the first embodiment.

Figure 7:
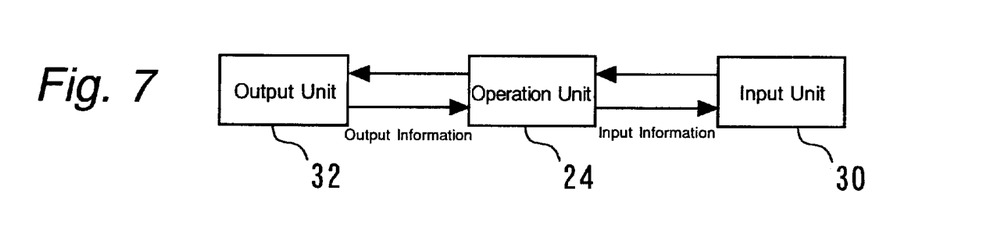
FIG. 7 is a block diagram of a characteristic evaluation apparatus practiced as a second variation of the first embodiment.

The first embodiment and its first variation were shown having the effective channel length Leff and external resistance Rsd computed inside the characteristic evaluation apparatus in question. However, this is not limitative of the invention. Alternatively, only the overlapping portion resistance Rdsw and sheet resistance Rsh may be computed within the characteristic evaluation apparatus. FIG. 7 is a block diagram of such a characteristic evaluation apparatus practiced as the second variation of the first embodiment. In the second variation of the embodiment, an external device is used to compute the external resistance values Rsd1 and Rsd2 of the groups 1 and 2 respectively, and the computed results are input through the input unit 30. This also provides the same results of computation as those obtained by the first embodiment.

Second Embodiment

Figure 8:
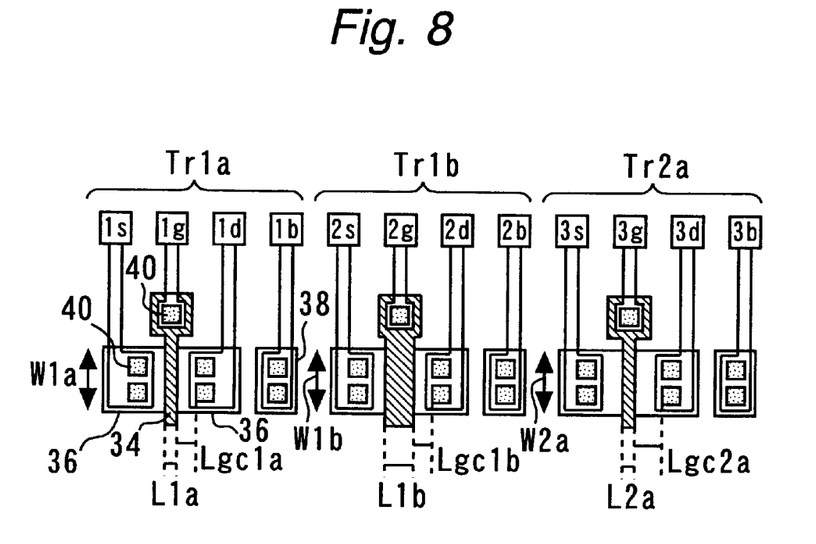
FIG. 8 is a plan view of a characteristic evaluation pattern for use with a second embodiment of this invention.

The second embodiment of this invention will now be described with reference to FIGS. 8 and 9. FIG. 8 is a plan view of a characteristic evaluation pattern for use with the second embodiment. The pattern in FIG. 8 includes three transistors Tr1a, Tr1b and Tr2a which have the same design as their counter parts Tr1a through Tr2a in the first embodiment. In computing the overlapping portion resistance Rdsw and sheet resistance Rsh, the second embodiment utilizes the transistor Tr1b in place of the transistor Tr2b contained in the first embodiment.

Figure 9:
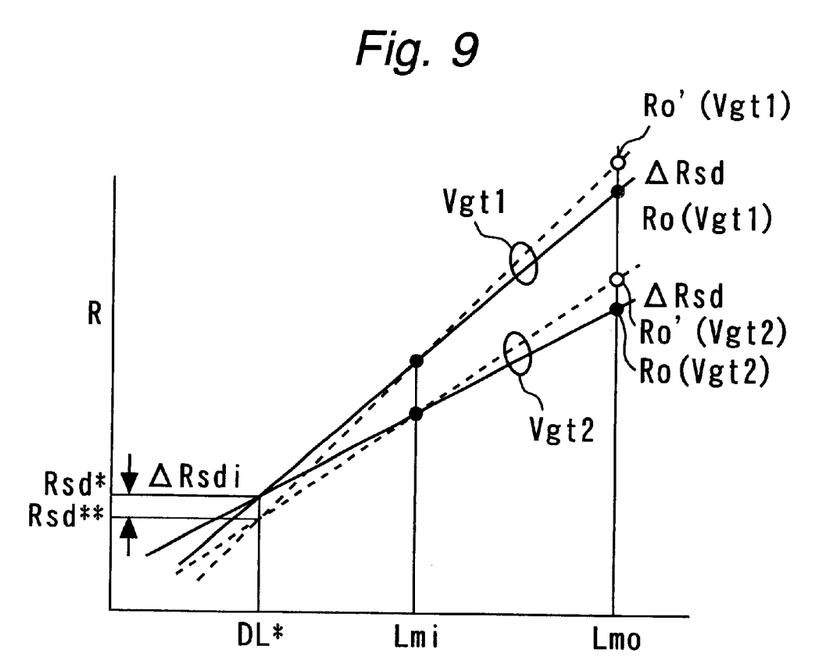
FIG. 9 is an explanatory view illustrating effects of errors in measuring external resistance Rsd of transistors which replace transistors having a normal gate-contact length and which have a different gate-contact length.

Described below with reference to FIG. 9 are conditions for computing the overlapping portion resistance Rdsw and sheet resistance Rsh using the transistor Tr1b instead of the transistor Tr2b. As shown in Table 1, the transistors Tr1b and Tr2b are designed to share the same gate length L and channel width W but to have different gate-contact lengths Lgc. Thus the difference in source-to-drain resistance R between the transistors Tr1b and Tr2b is attributable to the difference between their gate-contact lengths Lgc.

The first embodiment was shown finding the external resistance Rsd and length DL of the group 2 based on the source-to-drain resistance values R of the transistors Tr2a and Tr2b (see FIG. 4), and computing the overlapping portion resistance Rdsw and sheet resistance Rsh on the basis of the external resistance Rsd. It follows that if the transistor Tr2b is taken over by the transistor Tr1b, i.e., if the transistors Tr2a and Tr1b are to form the group 2, then some errors necessarily occur in the external resistance Rsd of the group 2.

FIG. 9 is an explanatory view illustrating effects of errors in measurements of substitute transistors. In FIG. 9, reference characters Ro(Vgt1) and Ro(Vgt2) denote source-to-drain resistance values of long transistors having a normal gate-contact length Lgc, and Ro'(Vgt1) and Ro'(Vgt2) represent source-to-drain resistance values of long transistors with their gate-contact length Lgc longer than the normal length.

As shown in FIG. 9, the external resistance Rsd** obtained on the basis of Ro'(Vgt1) and Ro'(Vgt2) is smaller than the external resistance Rsd* acquired based on Ro' (Vgt1) and Ro'(Vgt2). If the dependency of resistance Rsd on gate overdrive Vgt is assumed to be negligible and if the mask gate length Lmo of the long transistors meets the following relation:

$$Lmo > (1/r) \cdot (|\Delta Rsd|/Rsdi) \cdot Lmi \quad (6)$$

then the external resistance Rsd** determined by Ro'(Vgt1) and Ro'(Vgt2) becomes the external resistance Rsd of the short transistors. In the expression (6) above, reference character "r" denotes a relative error in sampling accuracy.

If it is assumed illustratively that $|\Delta Rsd|/Rsdi=0.5$, r=0.02 and Lmi=0.2 μm, then the conditions for accurately detecting the external resistance Rsd of the short transistors are represented by the expression:

$$Lmo > 5 \ \mu m \quad (7)$$

As shown in Table 1, the second embodiment has the gate length of 0.2 μm for the transistor Tr2a (i.e., short transistor) and 20 μm for the transistor Tr1b (long transistor). Thus the characteristic evaluation pattern of the second embodiment utilizes only three transistors to let the external resistance values of the group 1 (Tr1a and Tr1b) and group 2 (Tr2a and Tr1b) be determined accurately. As described, the second embodiment also makes it possible, as with the first embodiment, to measure with precision the primary characteristic values to determine the ability of MOSFETs to drive currents, i.e., the effective channel length Leff, overlapping portion resistance Rdsw, and sheet resistance Rsh.

Third Embodiment

Figure 10:
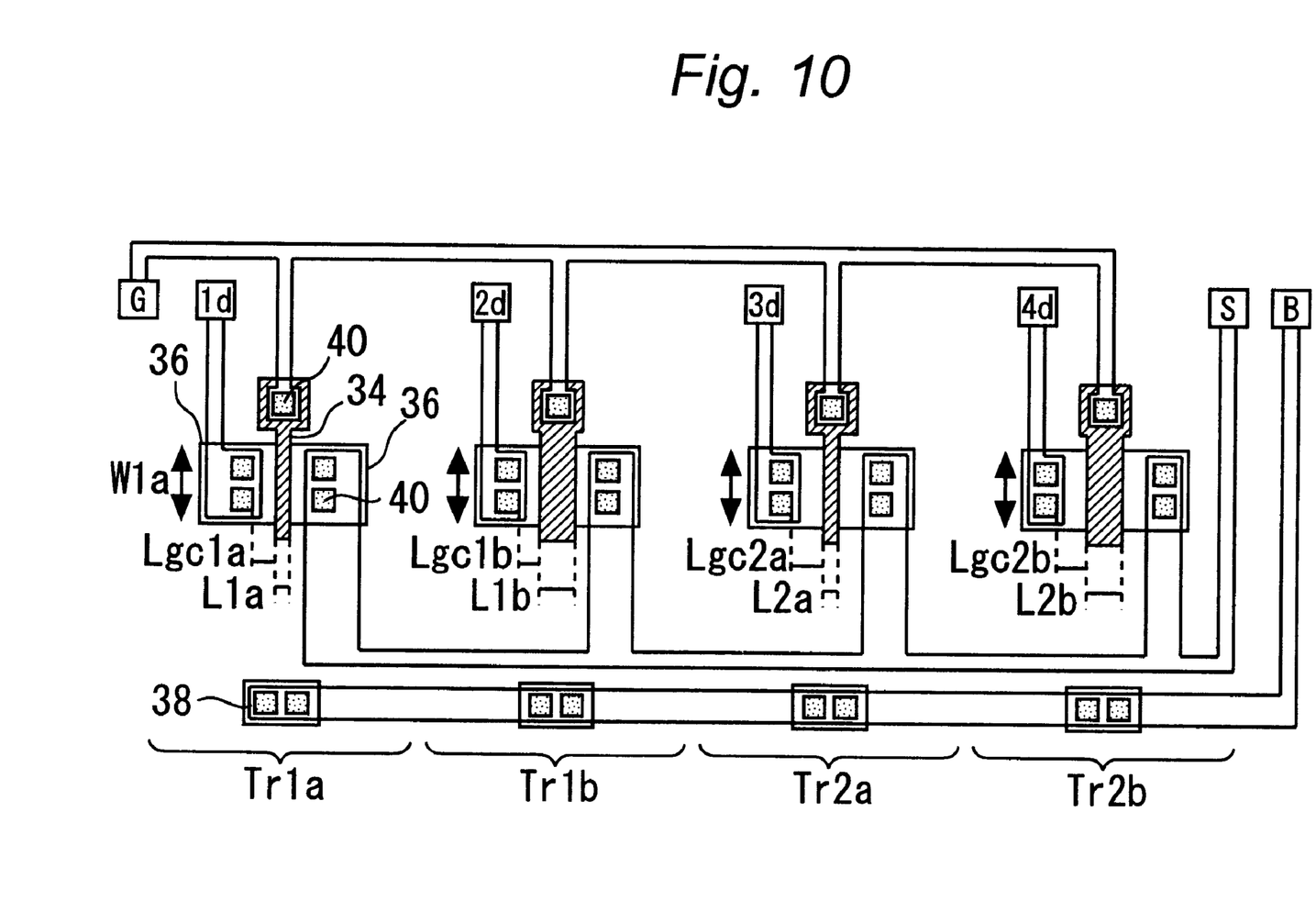
FIG. 10 is a plan view of a characteristic evaluation pattern for use with a third embodiment of this invention.

The third embodiment of this invention will now be described with reference to FIG. 10. FIG. 10 is a plan view of a characteristic evaluation pattern for use with the third embodiment. The pattern in FIG. 10 includes four transistors Tr1a, Tr1b, Tr2a and Tr2b. As in the case of the first embodiment, the transistors Tr1a through Tr2b have a gate electrode 34, S/D regions 36, a back gate electrode 38, and contacts 40 each.

The characteristic evaluation pattern of the first embodiment above was shown having the gate terminals 1g through 4g, source terminals 1s through 4s, and back gate terminals 1b through 4b furnished corresponding to the transistors Tr1a through Tr2b respectively. In contrast, the characteristic evaluation pattern of the third embodiment has a gate terminal G, a source terminal S and a back gate terminal B provided common to the four transistors Tr1a through Tr2b. This means that the characteristic evaluation pattern of the third embodiment has terminals fewer by nine than its counterpart of the first embodiment.

The transistors included in the characteristic evaluation pattern are used merely for measuring source-to-drain resistance, i.e., for measuring Vds–Ids relations. Such measurements can also be taken where the transistors have a gate terminal, a source terminal and a back gate terminal shared therebetween. Thus despite its simplicity in structure, the characteristic evaluation pattern of the third embodiment also makes it possible, as with the first embodiment, to measure with precision the primary characteristic values to determine the ability of MOSFETs to drive currents, i.e., the effective channel length Leff, overlapping portion resistance Rdsw, and sheet resistance Rsh.

Figure 11:
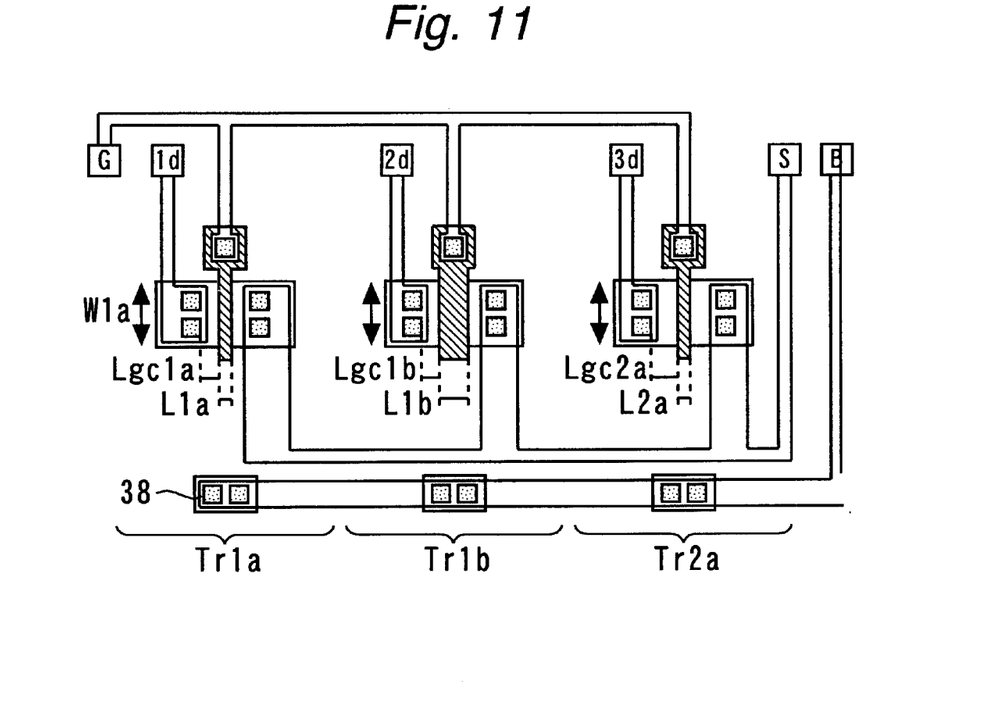
FIG. 11 is a plan view of a characteristic evaluation pattern practiced as a variation of the pattern used by the third embodiment.

FIG. 11 illustrates a characteristic evaluation pattern practiced as a variation of the pattern used by the third embodiment. The pattern in FIG. 11 comprises only three transistors Tr1a, Tr1b and Tr2a. As discussed above in connection with the second embodiment, the overlapping portion resistance Rdsw and sheet resistance Rsh of MOSFETs are obtained accurately using the transistor Tr1b in place of the transistor Tr2b. Thus despite its simplified structure, the characteristic evaluation pattern of this variation also makes it possible, as with the first embodiment, to measure with precision the overlapping portion resistance Rdsw and sheet resistance Rsh.

Fourth Embodiment

The fourth embodiment of this invention will now be described with reference to FIG. 12. As described above in connection with the first through the third embodiment, the overlapping portion resistance Rdsw and sheet resistance Rsh of MOSFETs are determined precisely by resorting to at least two groups of transistors. The accuracy of resistance measurements can be enhanced by raising the number of transistor groups to be tested.

Below is a description of processing performed when the number of transistor groups is increased. One external resistance value Rsd is obtained for each transistor group. If the transistor of the evaluation pattern in question has a width of W(i) and a gate-contact length of Lgc(i), then the following relation holds:

$$Rsd(i) \times W(i) = Rdsw + Rsh \times Lgc(i)$$

Figure 12:
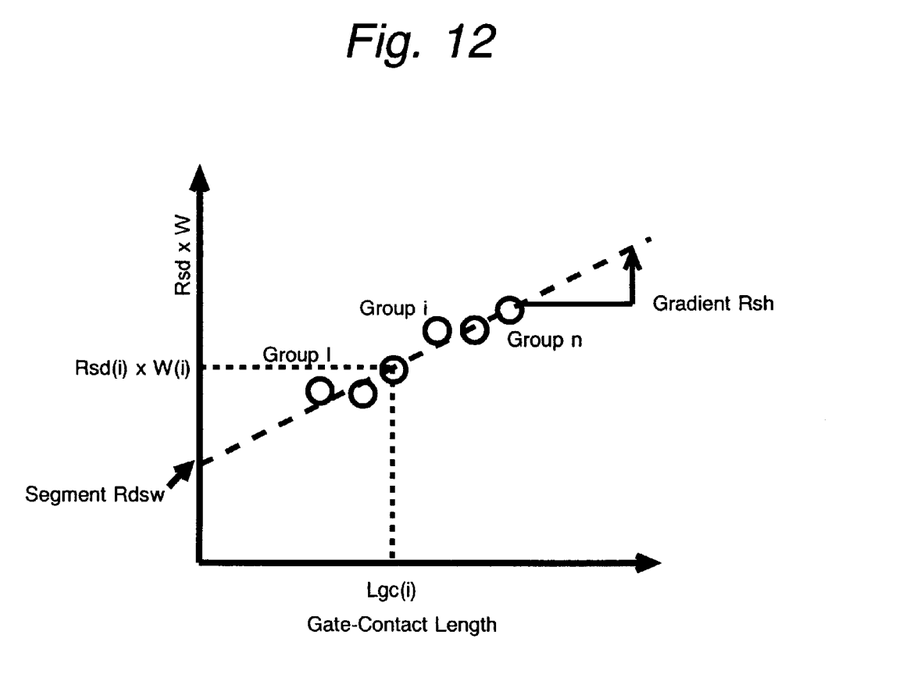
FIG. 12 is a graphic representation illustrating how a fourth embodiment of this invention performs its processing.

FIG. 12 plots measurements of the gate-contact length Lgc on the axis of abscissa versus values of Rsd×W on the axis of ordinate. The plotted data were taken from a plurality of transistor groups. In FIG. 12, a broken straight line represents a linear approximation obtained by the method of least squares based on the results corresponding to as many as "n" groups. With the fourth embodiment, the gradient of the linear approximation is defined as the sheet resistance Rsh and its segment as the overlapping portion resistance Rdsw. These resistance values are obtained more specifically using the following expressions:

$$Rsh = (n \times (\Sigma Lgc(i) \times Rsd(i) \times W(i)) - (\Sigma Lgc(i)) \times (\Sigma Rsd(i) \times W(i)))/((n \times \Sigma Lgc(i) \times Lgc(i)) - (\Sigma Lgc(i)) \times (\Sigma Lgc(i)))$$

$$Rdsw = ((\Sigma Lgc(i) \times Lgc(i)) \times (\Sigma Rsd(i) \times W(i)) - (\Sigma Lgc(i)) \times (\Sigma Lgc(i) \times Rsd(i) \times W(i)))/((n \times \Sigma Lgc(i) \times Lgc(i)) - (\Sigma Lgc(i)) \times (\Sigma Lgc(i)))$$

where, $\Sigma$ stands for $$\sum_{i=1}^{n}.$$

As described, the fourth embodiment allows the sheet resistance Rsh and overlapping portion resistance Rdsw of MOSFETs to be acquired on the basis of measurements taken from a plurality of transistor groups. As such, the fourth embodiment provides the resistance values at higher levels of accuracy than the first through the third embodiment of the invention.

This invention, when practiced illustratively in the manner described above, provides the following major effects:

According to one aspect of the invention, there are provided an apparatus and a method for obtaining simply and accurately two kinds of resistance of MOSFETs, i.e., sheet resistance Rsh in portions where the S/D regions do not overlap with the gate electrodes, and overlapping portion resistance Rdsw per unit length in portions where the S/D regions overlap with the gate electrodes, on the basis of external resistance values Rsd1 and Rsd2 of two evaluation patterns made up of MOSFET shaving different gate contact lengths Lgc.

In a preferred variation of the invention, a channel width W1 of a first evaluation pattern may be made equal to a channel width W2 of a second evaluation pattern (the same channel width designated by W). This arrangement simplifies the computations for acquiring the sheet resistance Rsh and overlapping portion resistance Rdsw of the MOSFETs.

In another preferred variation of the invention, a first external resistance Rsd1 and a second external resistance Rsd2 necessary for computing the sheet resistance Rsh and overlapping portion resistance Rdsw of the MOSFETs may be obtained based on a source-to-drain resistance of a first and a second transistors and on a source-to-drain resistance of a third and a fourth transistors.

In a further preferred variation of the invention, it is possible to obtain source-to-drain resistance values for each of the first through the fourth transistors in response to at least two kinds of gate overdrives. This arrangement permits acquisition of the first external resistance Rsd1 and the second external resistance Rsd2 based on the source-to-drain resistance values thus obtained.

According to another aspect of the invention, there is provided a characteristic evaluation pattern comprising a first, a second and a third transistors. The first and the second transistors have different gate lengths, so that a combination of the first and the second transistors may be used as a basis for obtaining a first external resistance Rsd1. The second and the third transistors also have different gate lengths, so that a combination of the second and the third transistors may be used as a basis for acquiring a second external resistance Rsd2. The first external resistance Rsd1 and second external resistance Rsd2 are in turn used as a basis for obtaining a sheet resistance Rsh and an overlapping portion resistance Rdsw of the transistors.

In an even further preferred variation of the invention, the characteristic evaluation pattern may additionally include a fourth transistor so that a combination of the third and the fourth transistors may be used as a basis for obtaining the second external resistance Rsd2, while the third and the fourth transistors have the same gate-contact length. This arrangement permits more accurate acquisition of the sheet resistance Rsh and overlapping portion resistance Rdsw of the MOSFETS.

In a still further preferred variation of the invention and as claimed in claim 3, all transistors may have the same channel width. This arrangement simplifies the computations for obtaining the sheet resistance Rsh and overlapping portion resistance Rdsw of the MOSFETs.

In a yet further preferred variation of the invention and as claimed in claim 4, all transistors may have a gate terminal, a source terminal and a back gate terminal furnished in common therebetween. This arrangement simplifies the structure of the characteristic evaluation pattern of MOSFETs.

Further, the present invention is not limited to these embodiments, but variations and modifications may be made without departing from the scope of the present invention.

The entire disclosure of Japanese Patent Application No. 2000-132079 filed on May 1, 2000 including specification, claims, drawings and summary are incorporated herein by reference in its entirety.

What is claimed is:

1. A characteristic evaluation pattern for evaluating MOSFET characteristics, the pattern comprising:
   a first transistor;
   a second transistor having a gate-contact length equal to that of said first transistor and a gate length different from that of said first transistor;
   a third transistor having a gate-contact length different from that of said first transistor and a gate length equal to that of said first transistor;
   a gate terminal, a source terminal, a drain terminal, and a back gate terminal electrically conducting to a gate electrode, source region, a drain region, and a back gate electrode of said first transistor respectively;
   a gate terminal, a source terminal, a drain terminal, and a back gate terminal electrically conducting to a gate electrode, a source region, a drain region, and a back gate electrode of said second transistor respectively; and a gate terminal, a source terminal, a drain terminal, and a back gate terminal electrically conducting to a gate electrode, a source region, a drain region, and a back gate electrode of said third transistor respectively.

2. The characteristic evaluation pattern according to claim 1, further comprising:

a fourth transistor having a gate-contact length equal to that of said third transistor and a gate length different from that of said third transistor; and a gate terminal, a source terminal, a drain terminal, and a back gate terminal electrically conducting to a gate electrode, a source region, a drain region, and a back gate electrode of said fourth transistor respectively.

3. The characteristic evaluation pattern according to claim 1, wherein said transistors all have the same channel width.

4. The characteristic evaluation pattern according to claim 1, wherein said gate terminals, said source terminals and said back gate terminals are replaced respectively by a gate terminal, a source terminal and a back gate terminal which are common to all transistors.

* * * * *